United States Patent
Lee et al.

(10) Patent No.: US 7,436,117 B2
(45) Date of Patent: Oct. 14, 2008

(54) ORGANIC ELECTROLUMINESCENCE DEVICE WITH AN ABSORBENT FOR MOISTURE AND OXYGEN, AND METHOD FOR MANUFACTURING THE SAME

(75) Inventors: Jong-Hyuk Lee, Yongin-si (KR); Hae-Seung Lee, Seoul (KR); Yoon-Hyeung Cho, Yongin-si (KR); Won-Jong Kim, Seoul (KR); Jin-Woo Park, Yongin-si (KR)

(73) Assignee: Samsung SDI Co., Ltd., Suwon (KR)

(*) Notice: Subject to any disclaimer, the term of this patent is extended or adjusted under 35 U.S.C. 154(b) by 0 days.

(21) Appl. No.: 10/924,880

(22) Filed: Aug. 25, 2004

(65) Prior Publication Data
US 2005/0046348 A1 Mar. 3, 2005

(30) Foreign Application Priority Data
Aug. 26, 2003 (KR) .................. 10-2003-0059141

(51) Int. Cl.
*H01J 17/24* (2006.01)
*H01J 29/94* (2006.01)

(52) U.S. Cl. ................... 313/555; 313/481; 313/549

(58) Field of Classification Search ............ 313/481, 313/545–549, 550–562; 252/181.1, 181.5, 252/194
See application file for complete search history.

(56) References Cited

U.S. PATENT DOCUMENTS

| 5,882,761 A * | 3/1999 | Kawami et al. ........... 313/506 |
| 5,888,367 A * | 3/1999 | Mouri et al. .............. 204/483 |
| 6,737,176 B1 * | 5/2004 | Otsuki et al. ............. 313/506 |
| 2001/0016579 A1 * | 8/2001 | Sato et al. ................. 514/183 |
| 2002/0015818 A1 * | 2/2002 | Takahashi et al. .......... 428/76 |
| 2002/0063515 A1 * | 5/2002 | Goto ........................ 313/500 |
| 2002/0197511 A1 * | 12/2002 | D'Andrade et al. ...... 313/506 |
| 2003/0170496 A1 * | 9/2003 | Hieda et al. .............. 313/504 |
| 2005/0046338 A1 * | 3/2005 | Park ......................... 313/504 |
| 2005/0046345 A1 * | 3/2005 | Park ......................... 313/506 |

FOREIGN PATENT DOCUMENTS

| JP | 05124330 A * | 5/1993 |
| JP | 09-148066 | 6/1997 |
| KR | 10-2003-0034889 | 5/2003 |

* cited by examiner

*Primary Examiner*—Peter Macchiarolo
(74) *Attorney, Agent, or Firm*—H.C. Park & Associates, PLC

(57) ABSTRACT

Provided are an organic electroluminescent device and a method of manufacturing the same. An organic electroluminescent device, comprising a rear substrate, an organic electroluminescent unit formed on one surface of the rear substrate and having a first electrode, an organic film, and a second electrode, and a front substrate joined to the rear substrate and having a porous oxide layer based on alumina on an inner surface of the front substrate. The alumina is hydrated amorphous alumina. The porous oxide layer is composed of hydrated amorphous alumina; hydrated amorphous alumina and silica; hydrated amorphous alumina, and one or more selected from alkaline metal oxide, alkaline earth metal oxide, metal halide, metal sulfate, and metal perchlorate, which are captured in a network of the alumina; or hydrated amorphous alumina, silica, and one or more selected from alkaline metal oxide, alkaline earth metal oxide, metal halide, metal sulfate, and metal perchlorate, which are captured in a network of the alumina and a network of the silica. The organic electroluminescent device may be used as a front emission type, a rear emission type, or a both-direction emission type display.

8 Claims, 1 Drawing Sheet

ORGANIC ELECTROLUMINESCENCE DEVICE WITH AN ABSORBENT FOR MOISTURE AND OXYGEN, AND METHOD FOR MANUFACTURING THE SAME

This application claims the benefit of Korean Patent Application No. 2003-59141, filed on Aug. 26, 2003, in the Korean Intellectual Property Office, which is hereby incorporated by reference for all purposes as if fully set forth herein.

BACKGROUND OF THE INVENTION

1. Field of the Invention

The present invention relates to an organic electroluminescent device and a method of manufacturing the same. More particularly, the present invention relates to an organic electroluminescent device using a porous oxide layer for adsorbing moisture and oxygen, and a method of manufacturing the same.

2. Discussion of the Related Art

Organic electroluminescent devices (organic EL devices) are self emissive displays that emit light by recombination of electrons and holes in an organic thin layer when a current is applied to the thin layer. Organic EL devices are lightweight, have simple constitutional elements, are easily fabricated, and they have superior image quality and a wide viewing angle. Additionally, organic EL device electrical properties, such as complete creation of moving pictures, high color purity, low power consumption, and low driving voltage, are suitable for portable electronic equipment.

However, moisture may easily deteriorate an organic EL device. Therefore, an encapsulation structure preventing moisture entry is required.

Typically, a metal can or a glass substrate processed into a cap with an etched groove is used. According to this method, for moisture adsorption, a powder type desiccant is mounted in the groove or a film type desiccant is adhered in the groove with double-sided tape. However, the former method is complicated and costly. Additionally, substrate thickness increases and since the substrate is not transparent, the increased thickness may impede front emission. On the other hand, the latter process may not sufficiently prevent moisture entry and the desiccant may break easily during fabrication or use, thereby lowering durability and reliability, which renders mass production difficult. In addition to the above problems, etched glass may be easily damaged by external impact due to structural weakness.

Japanese Patent Laid-Open Publication No. Hei. 9-148066 discloses an organic EL device including a laminate having a pair of opposite electrodes with an organic light-emitting material layer interposed therebetween, an airtight container for preventing exposure of the laminate to the air, and drying means made of, for example, alkaline metal oxide, disposed in the airtight container. However, the organic EL device's thickness is increased by the airtight container's bulky shape. Also, opaqueness of the drying means renders the fabrication of a front emission type organic EL device difficult, even though the drying means is maintained in a solid state after adsorbing moisture. Additionally, as described above, the fabrication process is complicated and costly.

SUMMARY OF THE INVENTION

Accordingly, the present invention is directed to an organic electroluminescent device and a method of manufacturing the same that substantially obviates one or more of the problems due to limitations and disadvantages of the related art.

The present invention provides an organic EL device with improved adsorptivity of moisture and oxygen, which allows the organic EL device to be used as a front emission type.

The present invention also provides a method of manufacturing the organic EL device.

Additional features of the invention will be set forth in the description which follows, and in part will be apparent from the description, or may be learned by practice of the invention.

The present invention discloses an organic EL device comprising a rear substrate, an organic electroluminescent unit formed on one surface of the rear substrate and having a first electrode, an organic film, and a second electrode. A front substrate is joined to the rear substrate and has a porous oxide layer based on alumina on an inner surface of the front substrate.

The present invention also discloses a method of manufacturing an organic EL device comprising preparing a rear substrate having a first electrode, an organic film, and a second electrode, coating a composition for forming an alumna comprising aluminum alkoxide and a polar solvent on an inner surface of the front substrate and thermally treating the composition to form a porous oxide layer based on alumina. A sealant is coated on at least a side of the rear substrate and on at least a side of the front substrate, and the rear substrate and the front substrate are joined together.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Reference will now be made in detail to an embodiment of the present invention, example of which is illustrated in the accompanying drawings.

An organic EL device of the present invention may have excellent adsorptivity of moisture and oxygen due to a porous oxide layer based on alumina, which may be hydrated amorphous alumina.

The porous oxide layer may be composed of (i) hydrated amorphous alumina or a mixture of the hydrated amorphous alumina with porous silica, or (ii) a complex using an adsorbent material mixed with the hydrated amorphous alumina or the mixture of the hydrated amorphous alumina and the porous silica. The porous oxide layer composed of (i) may promote physisorption and the porous oxide layer composed of (ii) may promote both physisorption and chemisorption, thereby increasing adsorptivity. When the porous oxide layer is composed of alumina, a surface hydroxyl group plays a role in the adsorption of moisture and oxygen. On the other hand, when the porous oxide layer is composed of alumina and silica, silanol groups distributed in pore walls of the porous oxide layer play a role in the adsorption of moisture and oxygen.

Figure 1:
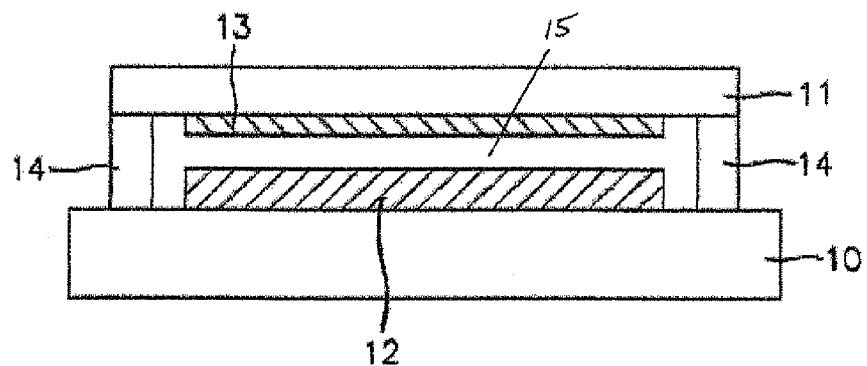
FIG. 1 shows an organic EL device according to an exemplary embodiment of the present invention.

FIG. 1 shows an organic EL device according to an exemplary embodiment of the present invention.

Referring to FIG. 1, an organic EL device includes a rear substrate 10 made of a glass or a transparent insulating material, an organic EL unit 12 formed on one surface of the rear substrate 10, having a sequentially stacked structure of a first electrode, an organic film, and a second electrode, and a front substrate 11 joined to the rear substrate 10 to seal an internal space 15 accommodating the organic EL unit 12. An inner surface of the front substrate 11 has a porous oxide layer 13. The front substrate 11 and the rear substrate 10 are joined by a sealant 14 coated outside the organic EL unit 12.

The organic EL unit 12 may be formed by deposition. The first electrode may be a cathode and the second electrode may be an anode. The organic film includes a hole injection layer, a hole transport layer, a light-emitting layer, an electron injection layer, and/or an electron transport layer.

The front substrate 11 may be made of an insulating material such as glass or a transparent plastic material. When made of a transparent plastic material, a protective film may be formed on an inner surface thereof to prevent moisture entry. The protective film may have resistance to heat, chemicals, and humidity. An organic EL device having a transparent front substrate may be used as a front emission type.

As a rear emission type display, the first electrode of the organic EL unit 12 may be transparent, and the second electrode may be reflective. On the other hand, as a front emission type display, the first electrode of the organic EL unit 12 may be reflective, and the second electrode may be transparent. The first electrode is installed closer to the rear substrate 10 than the second electrode, and the second electrode is installed closer to the front substrate 11 than the first electrode.

A protective film may be further formed on an upper surface of the second electrode to allow for planarization of the organic EL unit 12 and provide resistance to heat, chemicals, and humidity. The protective film may be made of an inorganic material such as metal oxide or metal nitride.

The space 15 defined by the front substrate 11 and the rear substrate 10 may be maintained as a vacuum or filled with an inert gas.

Preferably, the porous oxide layer 13 has a thickness in the range of about 0.1 to about 12 μm. If the thickness of the porous oxide layer 13 is less than about 0.1 μm, adsorptivity may be insufficient. On the other hand, if the thickness of the porous oxide layer 13 is greater than about 12 μm, the porous oxide layer may contact a cathode and increase an area for moisture permeation.

The porous oxide layer may be composed of (i) hydrated amorphous alumina, (ii) a two component mixture of the hydrated amorphous alumina with porous silica, (iii) a two or more component mixture of the hydrated amorphous alumina with one or more selected from alkaline metal oxide, alkaline earth metal oxide, metal halide, metal sulfate, or metal perchlorate, or (iv) a three or more component mixture of the hydrated amorphous alumina, the silica, and the one or more selected from alkaline metal oxide, alkaline earth metal oxide, metal halide, metal sulfate, or metal perchlorate.

The porous oxide layer composed of (ii), i.e., the two component mixture of the hydrated amorphous alumina and the porous silica, may be formed in a two-layer structure of an alumina layer and a silica layer.

The one or more selected from alkaline metal oxide, alkaline earth metal oxide, metal halide, metal sulfate, and metal perchlorate may be captured in a network of alumina or a network of alumina and a network of silica.

When the porous oxide layer is composed of the hydrated amorphous alumina and the silica, a weight ratio of the hydrated amorphous alumina to the silica may be in a range of 0.1:1 to 1:1, but is not limited thereto.

The hydrated amorphous alumina may be boehmite (AlOOH) or bayerite (Al(OH)$_3$), both of which are alumina monohydrate.

The alkaline metal oxide may be lithium oxide (Li$_2$O), sodium oxide (Na$_2$O), or potassium oxide (K$_2$O), and the alkaline earth metal oxide may be barium oxide (BaO), calcium oxide (CaO), or magnesium oxide (MgO). The metal sulfate may be lithium sulfate (Li$_2$SO$_4$), sodium sulfate (Nai$_2$SO$_4$), calcium sulfate (CaSO$_4$), magnesium sulfate (MgSO$_4$), cobalt sulfate (CoSO$_4$), gallium sulfate (Ga$_2$(SO$_4$)$_3$), titanium sulfate (Ti(SO$_4$)$_2$), or nickel sulfate (NiSO$_4$). The metal halide may be calcium chloride (CaCl$_2$), magnesium chloride (MgCl$_2$), strontium chloride (SrCl$_2$), yttrium chloride (YCl$_2$), copper chloride (CuCl$_2$), cesium fluoride (CsF), tantalum fluoride (TaF$_5$), niobium fluoride (NbF$_5$), lithium bromide (LiBr), calcium bromide (CaBr$_3$), cerium bromide (CeBr$_4$), selenium bromide (SeBr$_2$), vanadium bromide (VBr$_2$), magnesium bromide (MgBr$_2$), barium iodide (BaI$_2$), or magnesium iodide (MgI$_2$). The metal perchlorate may be barium perchlorate (Ba(ClO$_4$)$_2$) or magnesium perchlorate (Mg(ClO$_4$)$_2$).

A method of manufacturing an organic EL device including the above-described porous oxide layer will now be described in detail.

First, an organic EL unit is formed on a rear substrate by sequentially stacking a first electrode, an organic film, and a second electrode. Next, a porous oxide layer based on alumina is formed by coating and thermally treating a composition including an aluminum alkoxide and a polar solvent on an inner surface of a front substrate. The porous alumina layer is formed by hydrolysis of the aluminum alkoxide, and dehydration and polycondensation of the hydrolyzed product.

Preferably, the thermal treatment is carried out at a temperature in the range of about 100 to about 550° C. If the temperature is less than about 100° C., an organic material, such as the polar solvent, may remain in the porous alumina layer. On the other hand, if it exceeds 550° C., it may deform a glass substrate.

The composition for alumina formation may be coated by spin coating, screen printing, or other similar methods.

The aluminum alkoxide may be aluminum triisopropoxide (Al(OPr)$_3$), aluminum tributoxide (Al(OBu)$_3$), or a mixture thereof. The polar solvent may be one or more selected from the group consisting of pure water, ethanol, methanol, butanol, isopropanol, and methylethylketone. The polar solvent may be used in an amount of 100 to 1,000 parts by weight, based on 100 parts by weight of the aluminum alkoxide.

The composition for alumina formation may further include a catalyst, such as nitric acid, hydrochloric acid, phosphoric acid, or sulfuric acid, for facilitating a hydrolysis reaction. The catalyst may be used in an amount of 0.1 to 0.9 moles, based on 1 mole of the aluminum alkoxide.

The composition for alumina formation may further include polyvinylalcohol, polyvinylpyrrolidone, or polyvinylbutyral, when needed. As used herein, the polyvinylalcohol, polyvinylpyrrolidone, and polyvinylbutyral enhance pore formation and coating characteristics. The polyvinylalcohol, polyvinylpyrrolidone, or polyvinylbutyral may be used in an amount of 1 to 50 parts by weight, based on 100 parts by weight of the aluminum alkoxide. The polyvinylalcohol, polyvinylpyrrolidone, and polyvinylbutyral may have average molecular weight of 5,000 to 300,000.

The composition for alumina formation may further include one or more selected from alkaline metal salt, alkaline earth metal salt, metal halide, metal sulfate, or metal perchlorate. Here, the alkaline metal salt or the alkaline earth metal salt may be used in an amount of 0.1 to 0.5 moles, based on 1 mole of the aluminum alkoxide.

A porous oxide layer having alkaline metal oxide and/or alkaline earth metal oxide may have higher adsorptivity than the above-described porous alumina layer.

The alkaline metal salt is an alkaline metal oxide precursor, and it may be sodium acetate, sodium nitrate, potassium acetate, or potassium nitrate. The alkaline earth metal salt may be calcium acetate, calcium nitrate, barium acetate, or barium nitrate. Examples of the metal halide, the metal sulfate, and the metal perchlorate are as described above.

The composition for alumina formation may further include a composition including silicon alkoxide and a polar solvent. Therefore, a completed porous oxide layer may be composed of a mixture of alumina and silica.

The silicon alkoxide may be represented by Formula 1 below and may be tetraethylorthosilicate (TEOS) or tetramethylorthosilicate (TMOS):

Formula 1

Wherein $R_1$, $R_2$, $R_3$, and $R_4$ are independently an alkyl group of $C_1$-$C_{20}$ or an aryl group of $C_6$-$C_{20}$.

The polar solvent for silica formation may be one or more selected from the group consisting of ethanol, methanol, butanol, isopropanol, methylethylketone, and pure water, like in the composition for alumina formation, and may be used in an amount of 100 to 1,000 parts by weight, based on 100 parts by weight of the silicon alkoxide.

The composition for forming silica may further include a catalyst, such as nitric acid, hydrochloric acid, phosphoric acid, or sulfuric acid, for facilitating a hydrolysis reaction. The catalyst may be used in an amount of 0.1 to 0.9 moles, based on 1 mole of the silicon alkoxide. If the content of the catalyst is less than 0.1 moles, process duration may increase. On the other hand, if it exceeds 0.9 moles, process control may be difficult.

The porous oxide layer has a thickness in the range of about 0.1 to about 12 μm, and it may sufficiently adsorb moisture and oxygen, thereby providing excellent sealing properties for an organic EL device.

After preparing the front substrate with the porous oxide layer as described above, using a screen printer, dispenser, or other similar method, a sealant is coated on at least one side of the front substrate and on at least one side of the rear substrate. The rear substrate and the front substrate are then joined to complete an exemplary embodiment of an organic EL device of the present invention.

An inner space of the organic EL device may contain a vacuum or an inert gas. Also, after the joining, the sealant may be cured by UV light, visible light, or heat.

Figure 2:
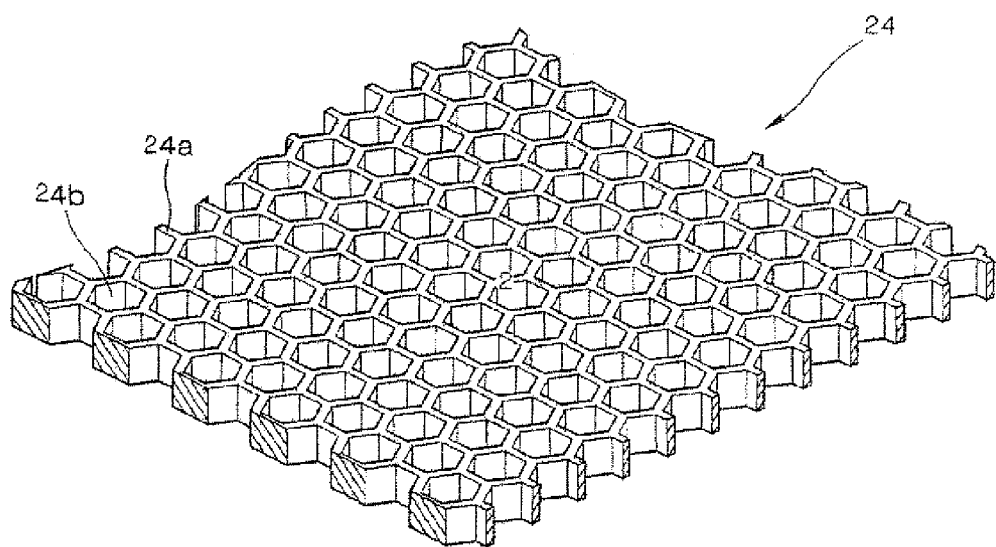
FIG. 2 shows a porous oxide layer used in an organic EL device according to an exemplary embodiment of the present invention.

FIG. 2 shows a porous oxide layer formed as described above.

Referring to FIG. 2, a porous oxide layer 24 includes an alumina based frame 24a and a plurality of adsorption holes 24b. The alumina frame 24a maintains the structure of the porous oxide layer 24, and the adsorption holes 24b adsorb moisture. The porous oxide layer 24 may be transparent before and/or after moisture adsorption as described above.

The adsorption holes have a diameter in the range of about 0.5 to about 100 nm, preferably 10 to 30 nm.

Depending on the porous oxide layer material, an organic EL device of the present invention may be used as a front emission type, a rear emission type, or a both-direction emission type. Specifically, when the porous oxide layer is transparent before and after moisture adsorption, i.e., when the porous oxide layer is made of a transparent material such as a transparent porous alumina, the device may be used as a front emission type. On the other hand, when the porous oxide layer is opaque before and after moisture adsorption, the device may be used as a rear emission type display.

Both passive matrix (PM) driving and active matrix (AM) driving may be used to drive an organic EL device according to an exemplary embodiment of the present invention.

Hereinafter, exemplary embodiments of the present invention will be described in more detail with reference to non-limiting Examples.

EXAMPLE 1

300 g of pure water was heated in a flask at 80° C. 165.54 g of Al(OPr)$_3$ was added thereto and stirred for 20 minutes. 1.2 g of hydrochloric acid (30%) was added thereto, and a resultant mixture was refluxed at 95° C. for three hours to obtain a transparent alumina solution.

60 g of pure water was added to 25 g of the transparent alumina solution and stirred for 20 minutes. 10 g of an aqueous solution of polyvinylalcohol (30 wt %, weight average molecular weight: 20,000) was added thereto and stirred for 20 minutes to obtain a coating solution for forming a porous alumina layer.

The coating solution was then coated on a soda glass substrate under rotation at 180 rpm for 120 seconds and then dried in a drying oven for about 2 minutes to remove an unevaporated solvent. The resultant was calcined at 500° C. for 30 minutes to form the porous alumina layer.

After cleaning the glass substrate with the porous alumina layer, a sealant was coated on at least a side of the glass substrate with the porous alumina layer and at least a side of a glass substrate with a first electrode, an organic film, and a second electrode, followed by joining, to complete an organic EL device.

EXAMPLE 2

An organic EL device was completed in the same manner as in Example 1 except that the coating solution for forming the porous alumina layer was prepared using Al(OBu)$_3$ instead of Al(OPr)$_3$.

Comparative Example 1

An organic EL device was completed in the same manner as in Examples 1 and 2 except that the porous alumina layer was not formed on the soda glass substrate.

The images of the organic EL devices according to Examples 1-2 and Comparative Example 1 were observed using a microscope at 70° C., 90% RH with time.

The organic EL devices of Examples 1-2 exhibited remarkably enhanced life span characteristics relative to the organic EL device according to Comparative Example 1.

An organic EL device of the present invention may provide the following advantages.

First, an unetched flat glass may be used for a front substrate. Therefore, structural weakness (fracture property) caused by using etched glass may be overcome.

Second, an inner surface of a front substrate has a porous oxide layer for adsorbing moisture and oxygen, which may eliminate a need to use a separate getter material. Also, depending on porous oxide layer material, the organic EL device may be used as a front emission type, a rear emission type, or a both-direction emission type display. Third, one uniform, wide area coating is used to form the porous oxide layer, as compared to a conventional sol-gel method for thick film formation. The porous oxide layer thus formed may adsorb moisture and oxygen very effectively.

According to the present invention, the adsorptivity of moisture and oxygen is enhanced by using a porous oxide layer, thereby providing an organic EL device with an extended life span.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising: a rear substrate;
   an organic electroluminescent unit arranged on one surface of the rear substrate, wherein the organic electroluminescent unit includes a first electrode, an organic film, and a second electrode; and
   a front substrate coupled with the rear substrate, wherein the front substrate includes an uncovered non-resin porous oxide layer arranged directly on an inner surface of the front substrate, the uncovered non-resin porous oxide layer adhering itself directly to the inner surface of the front substrate,
   wherein the porous oxide layer is formed of a material selected from the group consisting of:
      hydrated amorphous alumina, and one or more compound selected from the group consisting of metal halide, metal sulfate, and metal perchlorate; and
      hydrated amorphous alumina, silica, and one or more compound selected from the group consisting of metal halide, metal sulfate, and metal perchlorate, and
      wherein the alumina is boehmite or bayerite.

2. The organic electroluminescent device of claim 1, wherein the one or more compound, which is selected from the group consisting of metal halide, metal sulfate, and metal perchlorate, is captured in a network of the hydrated amorphous alumina or a network of the hydrated amorphous alumina and the silica.

3. The organic electroluminescent device of claim 1, wherein
   the metal sulfate is selected from the group consisting of lithium sulfate (Li2SO$_4$), sodium sulfate (Nai$_2$SO$_4$), calcium sulfate (CaSO$_4$), magnesium sulfate (MgSO$_4$), cobalt sulfate (CoSO$_4$), gallium sulfate (Ga$_2$(SO$_4$)$_3$), titanium sulfate (Ti(SO$_{42}$), and nickel sulfate (NiSO$_4$);
   the metal halide is selected from the group consisting of calcium chloride (CaCl$_2$), magnesium chloride (MgCl$_2$), strontium chloride (SrCl$_2$), yttrium chloride (YCl$_2$), copper chloride (CuCl$_2$), cesium fluoride (CsF), tantalum fluoride (TaF$_5$), niobium fluoride (NbF$_5$), lithium bromide (LiBr), calcium bromide (CaBr$_3$), cerium bromide (CeBr$_4$), selenium bromide (SeBr$_2$), vanadium bromide (VBr$_2$), magnesium bromide (MgBr$_2$), barium iodide (BaI$_2$), and magnesium iodide (MgI$_2$); and
   the metal perchlorate is selected from the group consisting of barium perchlorate (Ba(ClO$_4$)$_2$) and magnesium perchlorate (Mg(ClO$_4$)$_2$).

4. The organic electroluminescent device of claim 1, wherein the first electrode is a transparent electrode and the second electrode is a reflective electrode, or the first electrode is a reflective type electrode and the second electrode is a transparent electrode.

5. The device of claim 1, wherein the non-resin porous oxide layer has a thickness in the range of 0.1 to 12 μm.

6. The device of claim 1, wherein the front substrate is coupled to the rear substrate by a sealant, wherein the sealant does not contact the porous oxide layer.

7. The device of claim 1, wherein a shape of the porous oxide layer corresponds to a shape of the organic electroluminescent unit.

8. An organic electroluminescent device, comprising:
   a rear substrate;
   an organic electroluminescent unit arranged on one surface of the rear substrate, wherein the organic electroluminescent unit includes a first electrode, an organic film, and a second electrode; and
   a front substrate coupled with the rear substrate, wherein the front substrate includes an uncovered non-resin porous oxide layer arranged directly on an inner surface of the front substrate, the uncovered non-resin porous oxide layer adhering itself directly to the inner surface of the front substrate,
   wherein the uncovered non-resin porous oxide layer is formed of a material selected from the group consisting of:
      hydrated amorphous alumina;
      hydrated amorphous alumina and silica;
      hydrated amorphous alumina, and one or more compound selected from the group consisting of alkaline metal oxide and alkaline earth metal oxide; and
      hydrated amorphous alumina, silica, and one or more compound selected from the group consisting of alkaline metal oxide, and alkaline earth metal oxide, and
      wherein the alumina is boehmite or bayerite.

* * * * *